United States Patent
Hung et al.

(10) Patent No.: US 6,194,300 B1
(45) Date of Patent: Feb. 27, 2001

(54) METHOD OF MANUFACTURING THE FLOATING GATE OF SPLIT-GATE FLASH MEMORY

(75) Inventors: Chih-Wei Hung; Chi-Jen Shih, both of Kaohsiung (TW)

(73) Assignee: Taiwan Semiconductor Mfg. Co. Ltd., Hsinchu (TW)

( * ) Notice: Subject to any disclaimer, the term of this patent is extended or adjusted under 35 U.S.C. 154(b) by 0 days.

(21) Appl. No.: 09/609,212

(22) Filed: Jul. 5, 2000

(30) Foreign Application Priority Data

Apr. 18, 2000 (TW) .................................................. 89107264

(51) Int. Cl.⁷ .............................................. H01L 21/8247
(52) U.S. Cl. ............................ 438/593; 438/594; 438/266
(58) Field of Search ..................... 438/257–267, 438/593–594

(56) References Cited

U.S. PATENT DOCUMENTS

| | | | |
|---|---|---|---|
| 4,997,781 | * | 3/1991 | Tigelaar . |
| 5,143,860 | * | 9/1992 | Mitchell et al. . |
| 5,476,801 | * | 12/1995 | Keshtbod . |
| 5,496,753 | * | 3/1996 | Sakurai et al. . |
| 5,707,897 | * | 1/1998 | Lee et al. ............................... 438/257 |
| 5,767,005 | * | 6/1998 | Doan et al. ........................... 438/593 |
| 5,907,775 | * | 5/1999 | Tseng ................................... 438/261 |
| 5,915,177 | * | 6/1999 | Tseng ................................... 438/264 |
| 6,008,112 | * | 12/1999 | Acocella et al. ..................... 438/593 |
| 6,069,040 | * | 5/2000 | Miles et al. ........................... 438/260 |
| 6,090,668 | * | 7/2000 | Lin et al. .............................. 438/266 |

* cited by examiner

Primary Examiner—Richard Booth
(74) Attorney, Agent, or Firm—Jiawei Huang; J C Patents

(57) ABSTRACT

A method for fabricating the floating gate of a split-gate flash memory. A patterned sacrificial layer is formed over a substrate. A doped polysilicon layer and an insulation layer are formed in sequence over the sacrificial layer. The doped polysilicon layer and the insulation layer above the sacrificial layer are removed by chemical-mechanical polishing. The exposed doped polysilicon layer is removed. Finally, the sacrificial layer is removed to complete the fabrication of the floating gate.

11 Claims, 4 Drawing Sheets

METHOD OF MANUFACTURING THE FLOATING GATE OF SPLIT-GATE FLASH MEMORY

CROSS-REFERENCE TO RELATED APPLICATION

This application claims the priority benefit of Taiwan application Ser. No. 89107264, filed Apr. 18, 2000.

BACKGROUND OF THE INVENTION

1. Field of Invention

The present invention relates to a method of manufacturing flash memory. More particularly, the present invention relates to a method of manufacturing the floating gate of a split-gate flash memory.

2. Description of Related Art

Nonvolatile memory is widely used in all kinds of electronic devices for storing structural data, program data and other repeatedly used data. Nonvolatile memory includes erasable programmable read-only memory (EPROM) and electrically erasable programmable ROM (EPROM), both having a flash memory structure.

In general, a flash memory unit has a floating gate and a control gate. The floating gate is made from polysilicon and is designed to hold electric charges. The control gate, on the other hand, is designed to control the storage and retrieval of data. The floating gate is under the control gate and is generally in a floating state not connected to any external circuit. The control gate is normally connected to a word line. Since data can be stored into, read from or removed from a flash memory a multiple of times, production growth is fast in the semiconductor industry.

FIG. 1 is a schematic cross-sectional view of a conventional flash memory unit. As shown in FIG. 1, a tunnel oxide layer 105, a floating gate 110, a polysilicon oxide layer 120, an oxide/nitride/oxide dielectric layer 125 and a control gate 130 are formed over a substrate 100. The substrate 100 also has a source terminal 135 and a drain terminal 140.

To erase data within the flash memory unit, the control gate 130 is connected to an external voltage source of about 14V. Utilizing the pointed tip 118 on the floating gate 110 to produce an intense electric field, electrons within the floating gate 110 are accelerated and injected into the control gate 130. Hence, the pointed tip structure 115 on the floating gate 110 is important for determining the efficiency of data removal.

FIGS. 2A through 2C are schematic cross-sectional views showing the progression of steps for producing a conventional split-gate flash memory.

As shown in FIG. 2A, a tunnel oxide layer 220, a doped polysilicon layer 225 and a silicon nitride layer 230 are formed in sequence over a substrate 200. Microlithographic and etching processes are carried out next to pattern the silicon nitride layer 230, thereby forming an opening 235.

A thermal oxidation is carried out, as shown in FIG. 2B. Hence, the doped polysilicon layer 225 that is exposed by the opening 235 is oxidized to form a polysilicon oxide layer 240.

The silicon nitride layer 230 is selectively removed using hot phosphoric acid. Using the polysilicon oxide layer 240 as an etching mask, the doped polysilicon layer 225 is etched to form a floating gate 225a, as shown in FIG. 2C.

Since the polysilicon oxide layer 240 is conventionally formed by a thermal oxidation, the uniformity of the layer, which is affected by doping concentration and size of the grains inside the layer, is difficult to control. Hence, the flash memory formed by the conventional method has an unstable and reliability issue.

SUMMARY OF THE INVENTION

Accordingly, one object of the present invention is to provide a method of producing the floating gate of a split-gate flash memory that has higher production yield and improved reliability.

To achieve these and other advantages and in accordance with the purpose of the invention, as embodied and broadly described herein, the invention provides a method of producing the floating gate of a split-gate flash memory. A patterned sacrificial layer is formed over a substrate so that a portion of the substrate is exposed. A doped polysilicon layer is formed above the substrate. The doped polysilicon layer above the sacrificial layer is removed by chemical-mechanical polishing, for example. An insulation layer is formed over the substrate. The insulation layer above the sacrificial layer is again removed by chemical-mechanical polishing, for example. The exposed doped polysilicon layer is removed to form the floating gate. Lastly, the sacrificial layer is removed.

This invention also provides an alternative method of producing the floating gate of a split-gate flash memory. A sacrificial layer is formed over a substrate. The sacrificial layer is patterned to form a plurality of openings that expose a portion of the substrate. A doped polysilicon layer and an insulation layer are formed in sequence over the substrate. The doped polysilicon layer and the insulation layer above the sacrificial layer are removed by chemical-mechanical polishing, for example. A portion of the doped polysilicon layer is removed to form a floating gate using the insulation layer as a mask. Lastly, the sacrificial layer is removed.

This invention does away with the thermal oxidation step in the conventional method used to form polysilicon oxide. Instead, a patterned sacrificial layer is formed over the substrate, and then a doped polysilicon layer and insulation layer are formed in sequence over the sacrificial layer. The insulation layer and the doped polysilicon layer above the sacrificial layer are removed by separate or a single chemical-mechanical polishing so that sharp corner can still be maintained and be easily controlled compared with the conventional polyoxidation layer near the upper peripheral region of the floating gate, which facilitates the erasure of stored data from the flash memory.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
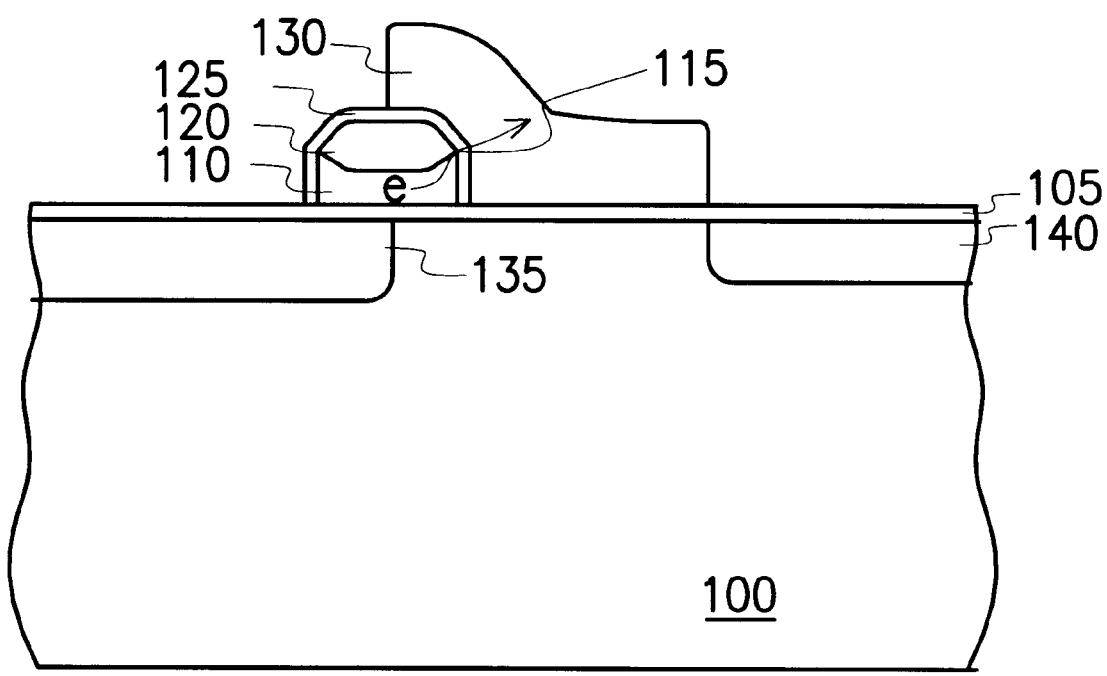
FIG. 1 is cross-sectional view of a conventional flash memory unit.
Figure 2A:
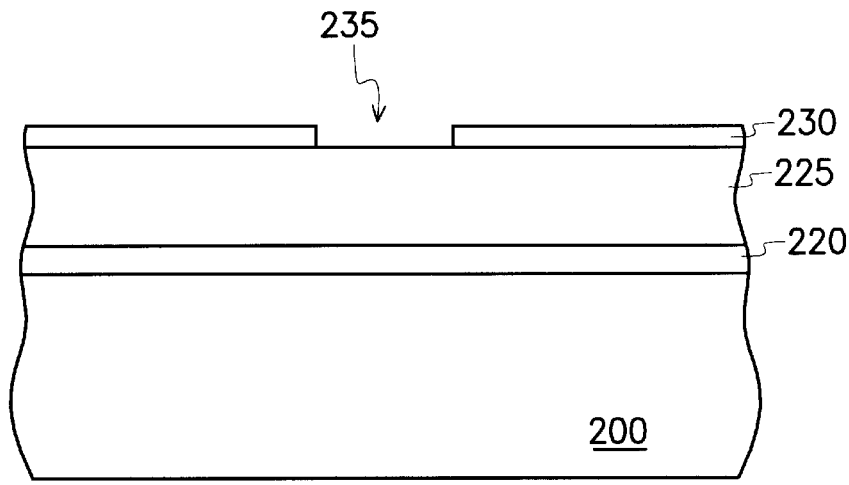
FIGS. 2A to 2C are schematic cross-sectional views showing the progression of steps for producing a conventional split-gate flash memory.
Figure 2B:
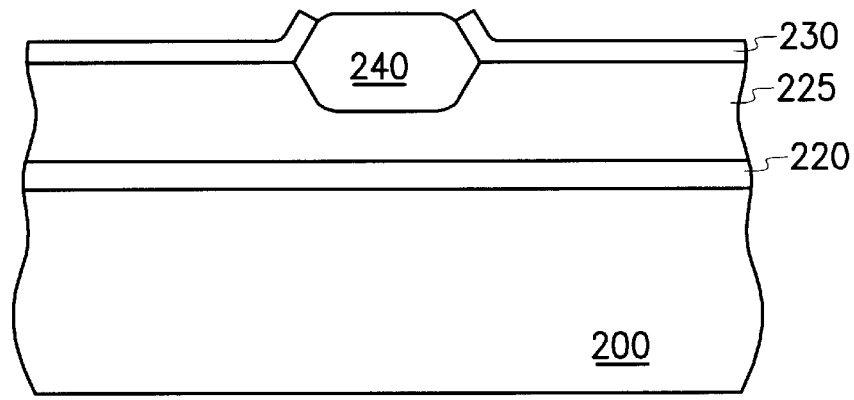
Figure 2C:
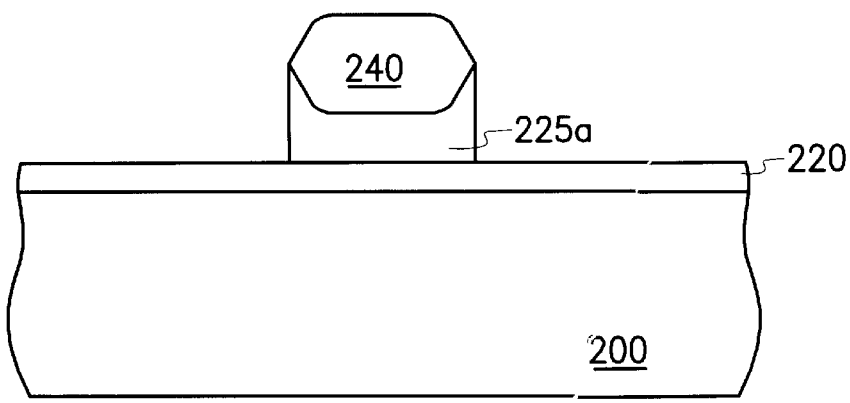

Reference will now be made in detail to the present preferred embodiments of the invention, examples of which are illustrated in the accompanying drawings. Wherever possible, the same reference numbers are used in the drawings and the description to refer to the same or like parts.

Figure 3A:
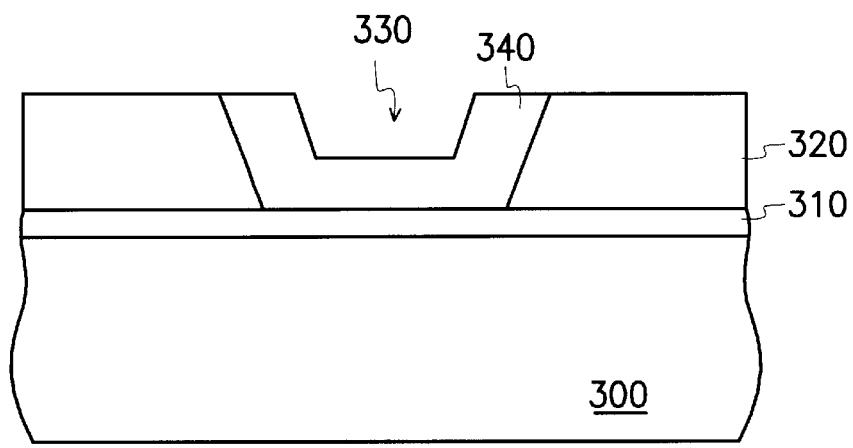
FIGS. 3A to 3C are schematic cross-sectional views showing the progression of steps for producing the floating gate of a split-gate flash memory according to a first preferred embodiment of this invention.
Figure 3B:
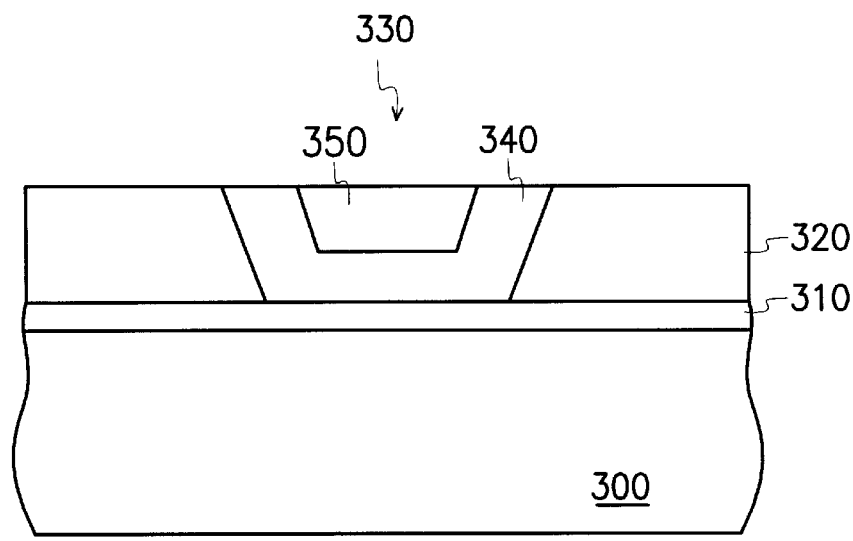
Figure 3C:
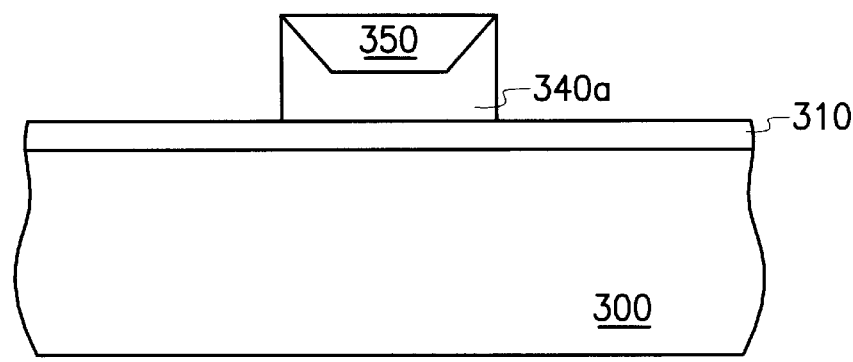

FIGS. 3A to 3C are schematic cross-sectional views showing the progression of steps for producing the floating gate of a split-gate flash memory according to a first preferred embodiment of this invention.

As shown in FIG. 3A, a buffer oxide layer 310 and a sacrificial layer 320 are formed in sequence over a substrate 300. The sacrificial layer 320 is patterned to form an opening 330 that exposes a portion of the buffer oxide layer 310. The exposed buffer oxide layer 310 is removed to expose the substrate 300 and a tunnel oxide layer is then formed on the exposed substrate 300. Since the tunnel oxide layer and the buffer oxide layer have the same characteristic, the tunnel oxide layer is denoted as 310 as the buffer layer 310. A conformal doped polysilicon layer is formed on the tunnel oxide layer 310. The doped polysilicon layer above the sacrificial layer 320 is removed to form a doped polysilicon layer 340 inside the opening 330. The sacrificial layer 320 can be a silicon nitride layer, for example. The doped polysilicon layer 340 above the sacrificial layer 320 can be removed by chemical-mechanical polishing, for example.

As shown in FIG. 3B, a conformal insulation layer is formed over the substrate 300. The insulation layer above the sacrificial layer 320 is removed to form an insulation layer 350 inside the opening 330. The insulation layer 350 functions as the polysilicon oxide layer (label 120 in FIG. 1) in a conventional flash memory. The insulation layer 350 can be a silicon oxide layer, for example. The insulation layer above the sacrificial layer 320 can also be removed by chemical-mechanical polishing, for example.

As shown in FIG. 3C, exposed doped polysilicon layer 350 is removed using the insulation layer 350 as a mask to form a floating gate 340a by an anisotropic etching operation, for example. The sacrificial layer 320 is removed by hot phosphoric acid to complete the fabrication of a split-gate flash memory.

Figure 4A:
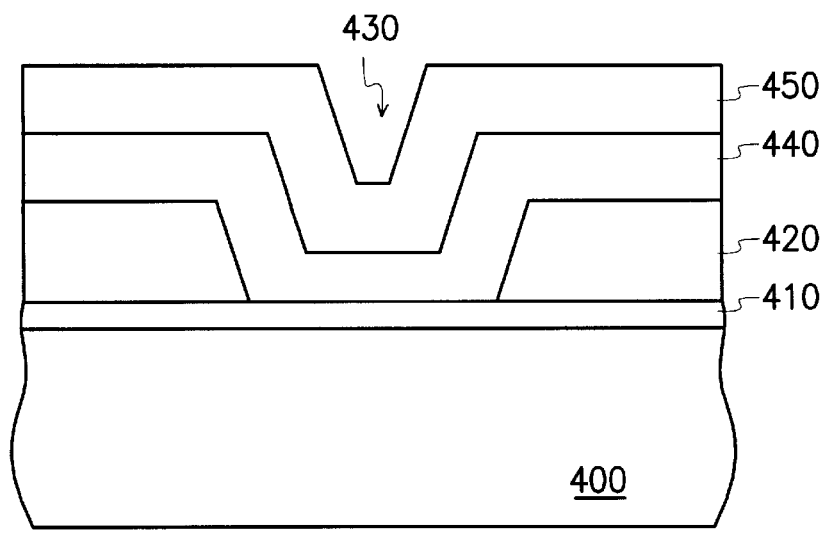
FIGS. 4A to 4C are schematic cross-sectional views showing the progression of steps for producing the floating gate of a split-gate flash memory according to a second preferred embodiment of this invention.
Figure 4B:
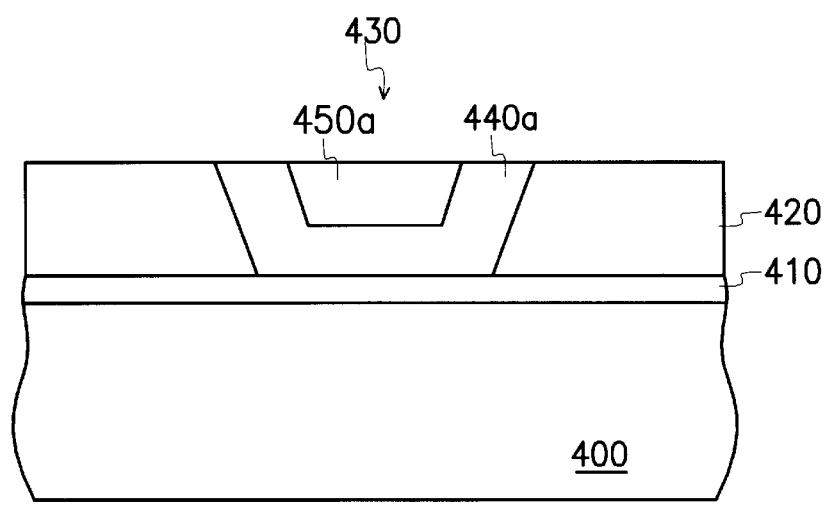
Figure 4C:
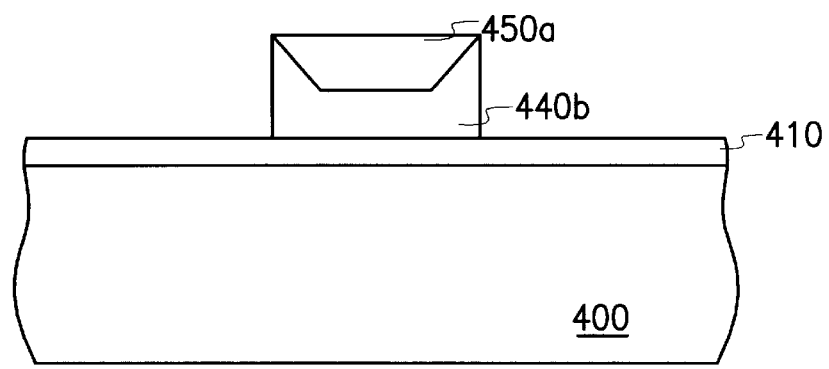

FIGS. 4A to 4C are schematic cross-sectional views showing the progression of steps for producing the floating gate of a split-gate flash memory according to a second preferred embodiment of this invention.

As shown in FIG. 4A, a buffer oxide layer 410 and a sacrificial layer 420 are formed in sequence over a substrate 400. The sacrificial layer 420 is patterned to form an opening 430 that exposes a portion of the buffer oxide layer 410. The exposed buffer oxide layer 410 is removed to exposed the substrate 400, then a tunnel oxide layer is formed on the exposed substrate 400. Since the tunnel oxide layer and the buffer oxide layer have the same characteristic, the tunnel oxide layer is denoted as 310 as the buffer layer 410. A doped polysilicon layer 440 and an insulation layer 450 are formed in sequence on the tunnel oxide layer 410. The sacrificial layer 420 can be a silicon nitride layer, and the insulation layer 450 can be a silicon oxide layer, for example.

As shown in FIG. 4B, the doped polysilicon layer 440 and the insulation layer 450 above the sacrificial layer 420 are removed so that a doped polysilicon layer 440a and an insulation layer 450a are retained inside the opening 430. The insulation layer 450a is equivalent to the polysilicon oxide layer (label 120 in FIG. 1) in a conventional split-gate flash memory. The doped polysilicon layer 440 and the insulation layer 450 above the sacrificial layer 420 can be removed by chemical-mechanical polishing, for example.

As shown in FIG. 4C, the exposed doped polysilicon layer 440a is removed using the insulation layer 450a as a mask so that the remaining doped polysilicon layer 440a forms a floating gate 440b. Finally, the sacrificial layer 420 is removed by hot phosphoric acid to complete the fabrication of the floating gate of the split-gate flash memory.

In summary, this invention does away with the thermal oxidation step in the conventional method used to form polysilicon oxide. In this invention, a patterned sacrificial layer is formed over the substrate, and then a doped polysilicon layer and insulation layer are formed in sequence over the sacrificial layer. The insulation layer and the doped polysilicon layer above the sacrificial layer are removed by separate or a single chemical-mechanical polishing so that sharp corners can still be maintained without side effect from the conventional polyoxidation layer near the upper peripheral region of the floating gate, which facilitates the erasure of stored data from the flash memory. In addition, the CMP process also reduces the difficulties of the subsequent polysilicon etching, comparing to the conventional practice.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating the floating gate of a split-gate flash memory, comprising the steps of:
   providing a substrate;
   forming a patterned sacrificial layer that exposes a portion of the substrate;
   forming a doped polysilicon layer over the substrate;
   removing the doped polysilicon layer above the sacrificial layer;
   forming an insulation layer over the substrate;
   removing the insulation layer above the sacrificial layer and exposing a portion of said first polysilicon layer;
   removing the exposed portion of the doped polysilicon layer; and
   removing the sacrificial layer.

2. The method of claim 1, wherein the step of forming the sacrificial layer includes depositing silicon nitride by chemical vapor deposition.

3. The method of claim 1, wherein the step of removing the doped polysilicon layer above the sacrificial layer includes chemical-mechanical polishing.

4. The method of claim 1, wherein the step of forming the insulation layer includes depositing silicon oxide by chemical vapor deposition.

5. The method of claim 1, wherein the step of removing the insulation layer above the sacrificial layer includes chemical-mechanical polishing.

6. The method of claim 1, wherein the step of removing the exposed doped polysilicon layer includes anisotropic etching.

7. A method for fabricating the floating gate of a split-gate flash memory, comprising the steps of:
provide a substrate;
forming a sacrificial layer over the substrate;
patterning the sacrificial layer to form a plurality of openings that expose the substrate;
forming a doped polysilicon layer over the substrate;
forming an insulation layer over the doped polysilicon layer;
removing the doped polysilicon layer and insulation layer above the sacrificial layer and exposing a portion of said first polysilicon layer;
removing the exposed portion of the doped polysilicon layer using the insulation layer as a mask; and
removing the sacrificial layer.

8. The method of claim 7, wherein the step of forming the sacrificial layer includes depositing silicon nitride by chemical vapor deposition.

9. The method of claim 7, wherein the step of removing the doped polysilicon layer above the sacrificial layer includes chemical-mechanical polishing.

10. The method of claim 7, wherein the step of removing the insulation layer and the doped polysilicon layer above the sacrificial layer includes chemical-mechanical polishing.

11. The method of claim 7, wherein the step of removing a portion of the doped polysilicon layer includes anisotropic etching.

* * * * *